United States Patent
Lee et al.

(10) Patent No.: US 7,012,742 B2
(45) Date of Patent: Mar. 14, 2006

(54) GAIN-CLAMPED SEMICONDUCTOR OPTICAL AMPLIFIER USING RAMAN AMPLIFICATION PRINCIPLE

(75) Inventors: Jeong-Seok Lee, Anyang-shi (KR); Seong-Taek Hwang, Pyongtaek-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 183 days.

(21) Appl. No.: 10/683,682

(22) Filed: Oct. 10, 2003

(65) Prior Publication Data

US 2004/0252367 A1    Dec. 16, 2004

(30) Foreign Application Priority Data

Jun. 11, 2003    (KR) .................... 10-2003-0037481

(51) Int. Cl.
*H01S 3/00* (2006.01)
(52) U.S. Cl. ...................................... 359/334; 359/344
(58) Field of Classification Search ................ 359/334, 359/344
See application file for complete search history.

(56) References Cited

U.S. PATENT DOCUMENTS

| | | | |
|---|---|---|---|
| 6,490,077 B1 * | 12/2002 | Conradi | 359/334 |
| 6,751,013 B1 * | 6/2004 | Wu | 359/337 |
| 2003/0090779 A1 * | 5/2003 | Lee | 359/334 |

FOREIGN PATENT DOCUMENTS

| | | | |
|---|---|---|---|
| EP | 001168530 A2 | * | 1/2002 |
| EP | 001469622 A1 | * | 10/2004 |
| JP | 2001147454 A | * | 5/2001 |

* cited by examiner

*Primary Examiner*—Mark Hellner
(74) *Attorney, Agent, or Firm*—Cha & Reiter, L.L.C.

(57) ABSTRACT

A gain-clamped semiconductor optical amplifier uses the Raman amplification principle. A Raman amplifier and a gain clamped semiconductor optical amplifier are integrated onto an optical amplifier module. The gain-clamped semiconductor optical amplifier includes: an optical fiber having Raman gain characteristics; and a gain-clamped semiconductor optical amplifier for providing a pumping light to the optical fiber by laser oscillation using a distributed Bragg reflector (DBR) lattice. The DBR has input and output terminals asymmetrical to each other, at least for amplifying a signal light Raman-amplified by the optical fiber.

20 Claims, 6 Drawing Sheets

GAIN-CLAMPED SEMICONDUCTOR OPTICAL AMPLIFIER USING RAMAN AMPLIFICATION PRINCIPLE

CLAIM OF PRIORITY

This application claims priority to an application entitled "Gain-clamped semiconductor optical amplifier using Raman amplification principle," filed in the Korean Intellectual Property Office on Jun. 11, 2003 and assigned Serial No. 2003-37481, the contents of which are hereby incorporated by reference.

BACKGROUND OF THE INVENTION

1. Field of the Invention

The present invention relates to the use of optical amplifiers. More particularly, the present invention relates to a gain-clamped semiconductor optical amplifier using Raman amplification principle in which a Raman amplifier and a semiconductor optical amplifier are monolithic integrated with each other.

2. Description of the Related Art

In an optical communication system having transmitters and receivers, and fiber etc., the signal light emitted from a transmitter suffers from a transmission loss. As a result, the signal arriving at a receiver has less power than the signal originally transmitted. If the case is such that a signal arriving at the receiver has a power reduced below a threshold value, it may be impossible to perform a normal optical communication because of a receiving errors. Therefore, it is known to arrange optical amplifiers between the transmitter and the receiver so as to amplify a signal light. Thus, optical amplifiers compensate for at least a portion of the transmission loss of the signal light transmitted through the optical transmission line.

In addition, the use of optical amplifiers dramatically increases the transmission distance without optical electrical conversion.

Optical amplifiers used for the above-mentioned purpose typically comprise one of an erbium-doped fiber amplifier (EDFA), a Raman amplifier, and a semiconductor optical amplifier (SOA).

The EDFA, which uses an optical fiber doped with the rare-earth elements (for example, Erbium) for amplification, features high gain, low noise figure (NF), and high saturation output power, thereby having been widely used in a backbone network or in a metro network. However, the EDFA has drawbacks in that the costs associated with this particular amplifier is high. Moreover, the operational wavelength of an EDFA is limited to the 1.5 $\mu$m band.

However, the gain spectrum of SOA could be changed from 1.1 um to 1.6 um by the control the band gap of gain material. The semiconductor optical amplifier has advantages in that it has a small size of a few cm and doesn't need a high-priced pumping light source.

Figure 1:
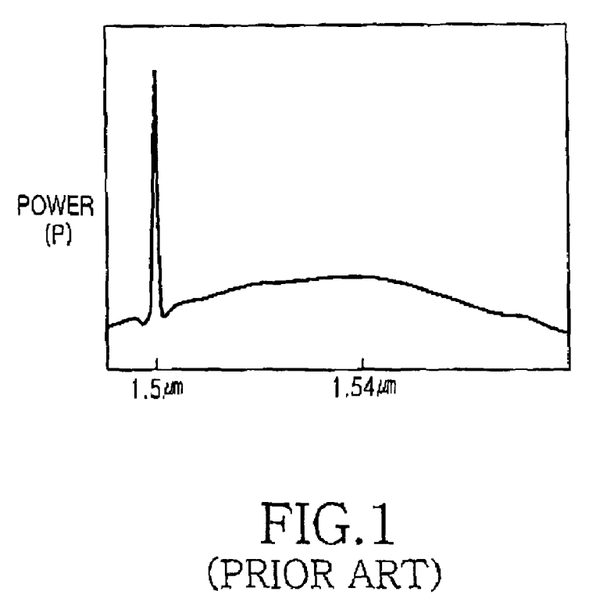
FIG. 1 is a view illustrating gain characteristics of a gain-clamped semiconductor optical amplifier (GC-SOA) according to the prior art.

FIG. 1 illustrates the gain characteristics of a gain-clamped semiconductor optical amplifier (GC-SOA) according to the prior art. The GC-SOA has excellent gain characteristics and saturation output power characteristics.

Figure 2:
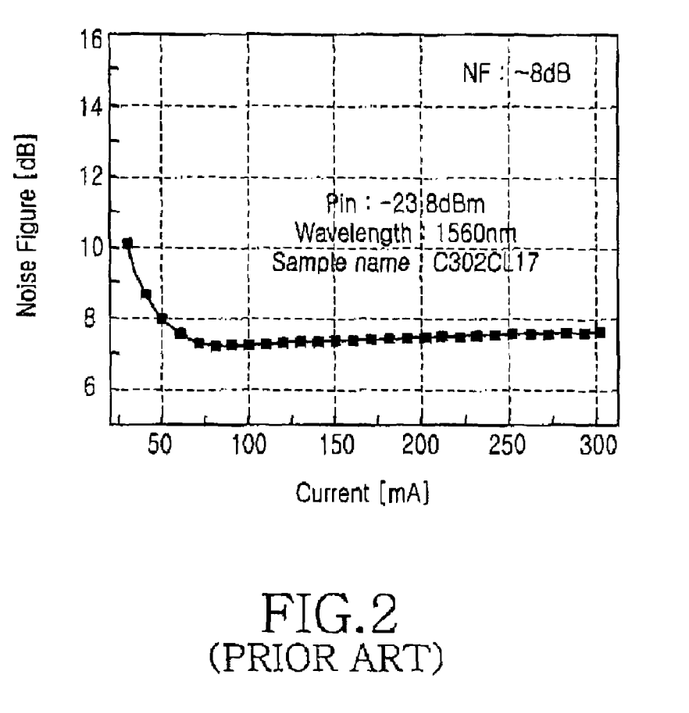
FIG. 2 is a view illustrating noise figure characteristics of a gain-clamped semiconductor optical amplifier (GC-SOA) according to the prior art.

However, as shown in FIG. 2, the gain-clamped semiconductor optical amplifier also has a very high noise figure, up to 8 dB, thereby having a limit in application in a metropolitan area or access area.

Finally, there is the Raman amplifier uses the Stimulated Raman Scattering (SRS) in an optical fiber. The Raman amplification method is a method for amplifying an optical signal by using a so-called SRS, in which a pumping light, which is a strong light, is incident into an optical fiber, to thereby cause a gain to appear on a longer wavelength side distanced about 100 nm from the wavelength of the pumping light by SRS. Subsequently, a signal light of the above wavelength band, in which the gain appears, is incident into the excited optical fiber, thereby amplifying the signal light. The Raman amplifier has an amplification band which can be controlled with comparative ease by properly setting the wavelength of the pumping light for Raman amplification, and features low noise figure.

The Raman amplifier also has drawbacks in that not only does this type of amplifier have a very low optical amplification efficiency, but the Raman amplifier also needs a high-priced pumping light source. In addition to the increased costs introduced by requiring a high-priced pumping light source, there is a problem with regard to that of size, as the whole optical amplifier module size is increased. In order to overcome the weaknesses of the different prior art optical amplifiers, technologies combining the semiconductor optical amplifier and the Raman amplifier have been recently proposed.

Figure 3:
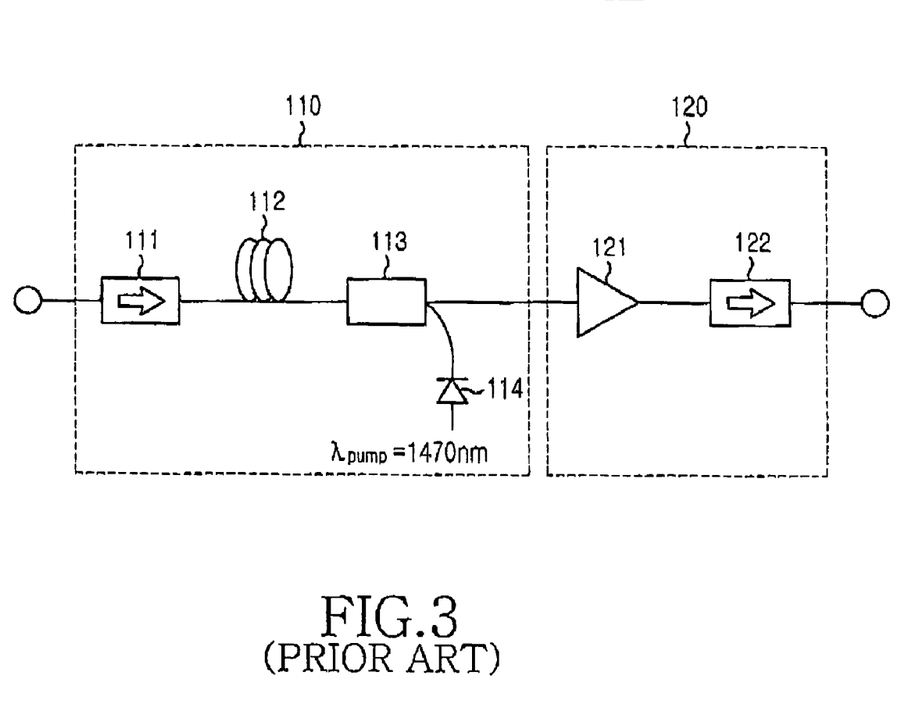
FIG. 3 is a view illustrating a construction example of an optical amplifier in which a semiconductor optical amplifier (SOA) and a Raman amplifier according to the prior art.

FIG. 3 illustrates an example of the construction of an optical amplifier in which a semiconductor optical amplifier (SOA) and a Raman amplifier according to the prior art.

The optical amplifier 100 comprises: a Raman amplification section 110 including a first optical isolator 111, a single-mode fiber (SMF) 112, a wavelength division multiplexing (WDM) coupler 113, and a pump laser diode 114; and a semiconductor optical amplification section 120 including a semiconductor optical amplifier 121 and a second optical isolator 122.

The operation principle of the optical amplifier shown in FIG. 3 will be explained as follows. First, when a 1470 nm pumping light by the laser diode 114 is injected in the reverse direction through the WDM coupler 113, an optical signal of 1560 nm wavelength band inputted through the input terminal is amplified by the Raman scattering phenomenon generated in the single-mode fiber 112. The optical signal, which is amplified by the backward-pumped Raman amplifier, is then input into the semiconductor optical amplifier 121, so as to be sufficiently amplified, and then is output through the second optical isolator 122. As described above, an input signal undergoes a Raman gain by the Raman amplification section 110 located in the front end of the semiconductor optical amplification section 120, thereby decreasing the noise figure of the semiconductor optical amplifier 121 as much as the gain.

Similar to the requirements of operating a single Raman amplifier, the hybrid optical amplifier, which is composed the Raman amplifier and a semiconductor optical amplifier, must use a high-power pump laser diode. Accordingly, the use of the laser pump makes it very difficult to reduce the size of the optical amplifier and to produce low-cost optical amplifiers. Furthermore, as the conventional optical amplifier drives two active elements, there is an additional disadvantage in that the power consumption is large.

SUMMARY OF THE INVENTION

Accordingly, the present invention has been made to solve at least the above-mentioned problems occurring in the prior art. The present invention provides a gain-clamped semiconductor optical amplifier using Raman amplification principle in which the gain-clamped semiconductor optical amplifier has high gain characteristics and a low noise figure, without additional pumping light source for a Raman amplifier.

In order to accomplish the claimed invention, there is provided a gain-clamped semiconductor optical amplifier that operates according to the Raman amplification principle, the gain-clamped semiconductor optical amplifier comprising: an optical fiber having Raman gain characteristics; and a gain-clamped semiconductor optical amplifier for providing a pumping light to the optical fiber by laser oscillation using a distributed Bragg reflector (DBR) lattice having input and output terminals asymmetrical to each other, and for amplifying a signal light Raman-amplified by the optical fiber.

The distributed Bragg reflector (DBR) lattice preferably has input and output terminals arranged asymmetrically to each other. The terminals are formed in such a manner that an optical power of an input terminal of the laser has a power of at least ten times larger than that of an output terminal of the laser.

It is also preferable that a pumping light supplied to the optical fiber has at least 70 nm shorter a wavelength band than a wavelength band of a transmission signal light.

In accordance with another aspect of the present invention, there is provided a gain-clamped semiconductor optical amplifier using the Raman amplification principle. The gain-clamped semiconductor optical amplifier comprises an optical fiber, in which input terminal and output terminals are asymmetric to each other, having Raman gain characteristics; and a gain-clamped semiconductor optical amplifier for amplifying a signal light Raman-amplified in the optical fiber by laser oscillation using a distributed Bragg reflector (DBR) lattice.

BRIEF DESCRIPTION OF THE DRAWINGS

The above features and advantages of the present invention will be more apparent from the following detailed description taken in conjunction with the accompanying drawings, in which.

DETAILED DESCRIPTION OF THE PREFERRED EMBODIMENT

Hereinafter, a gain-clamped semiconductor optical amplifier using the Raman amplification principle according to preferred embodiments of the present invention will be described with reference to the accompanying drawings. It is to be noted that the same elements are indicated with the same reference numerals throughout the drawings. For the purposes of clarity and simplicity a detailed description of known functions and configurations incorporated herein will be omitted as it may make the subject matter of the present invention unclear.

Figure 4:
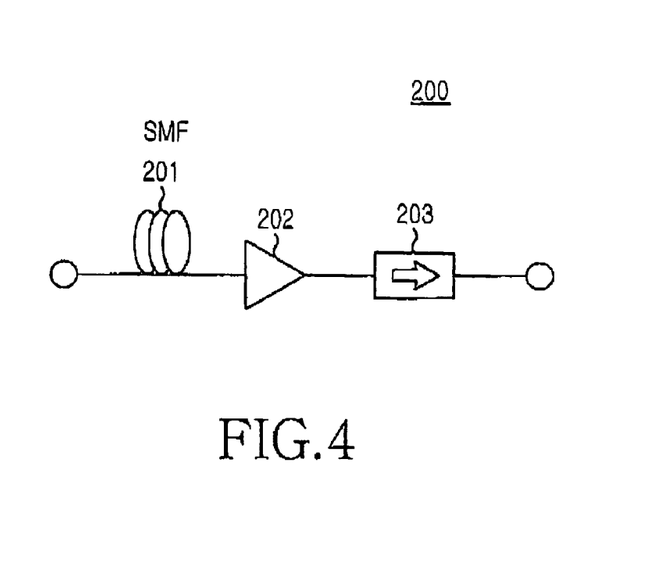
FIG. 4 is a construction view illustrating a semiconductor optical amplifier using the Raman amplification principle according to the present invention.

FIG. 4 is a construction view illustrating a gain-clamped semiconductor optical amplifier using the Raman amplification principle according to the present invention. The optical amplifier 200 comprises a single-mode fiber 201, a semiconductor optical amplifier 202, and an optical isolator 203.

The single-mode fiber 201, when being supplied with a pumping light, provides a gain on a longer wavelength side distanced about 100 nm from the wavelength of the pumping light by stimulated Raman scattering, and functions to amplify an input signal light having the same wavelength band as that of the gain.

Figure 5:
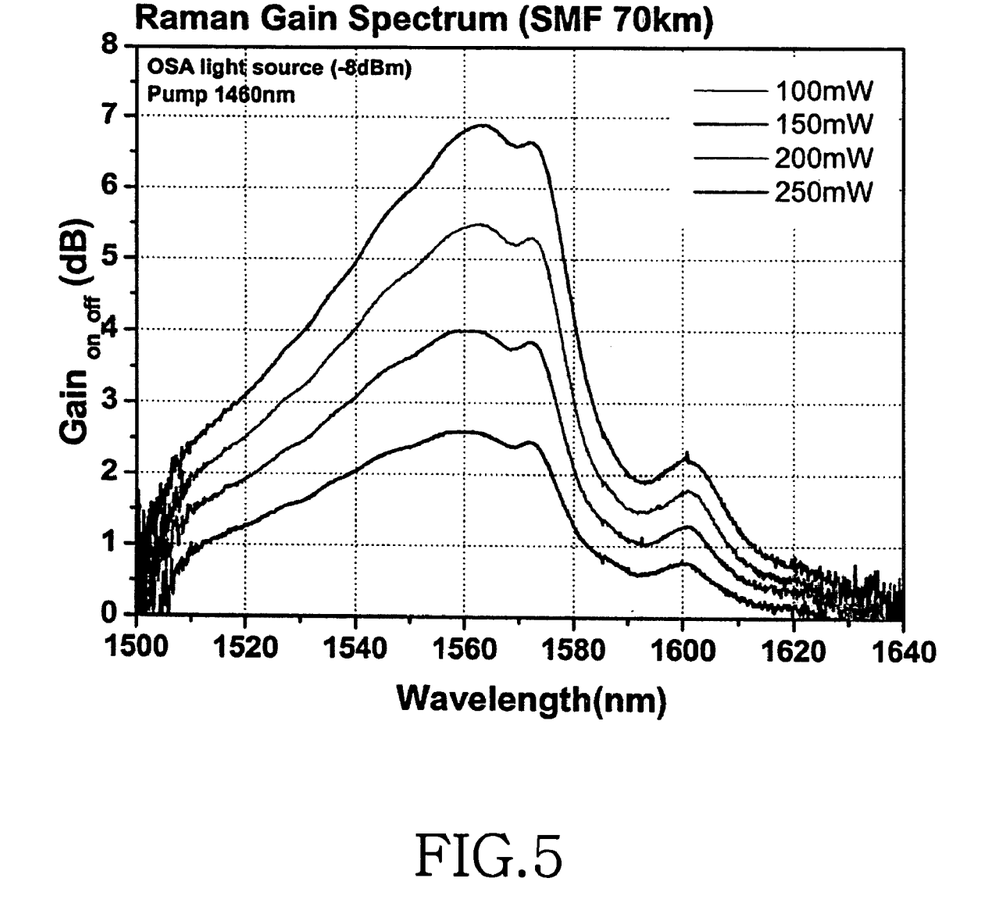
FIG. 5 is a view illustrating Raman gain characteristics of 70 km single-mode fiber.

FIG. 5 is a view illustrating Raman gain characteristics of 70 km single-mode fiber. The relationship between gains according to pumping powers supplied to a single-mode fiber and gains according to pumping wavelengths can be noted by a spectrum shown in FIG. 5. Using the relations of gain characteristics from FIG. 5, it is possible to calculate values of a gain-clamping wavelength and a power that can make the gain-clamped semiconductor optical amplifier (GC-SOA) have a low noise figure and gain flatness characteristics. Although the results shown in FIG. 5 is an example for explaining the present invention, the scope of the prevent invention is not to be limited to the kind and the length of the optical fiber shown in the embodiment.

The gain-clamped semiconductor optical amplifier 202 according to the present invention has the same structure as that of a normal gain-clamped semiconductor optical amplifier, and has a constant carrier density by laser oscillation using a distributed Bragg reflector (DBR) lattice, thereby constantly maintaining the optical gain although its drive current is changed.

Figure 6:
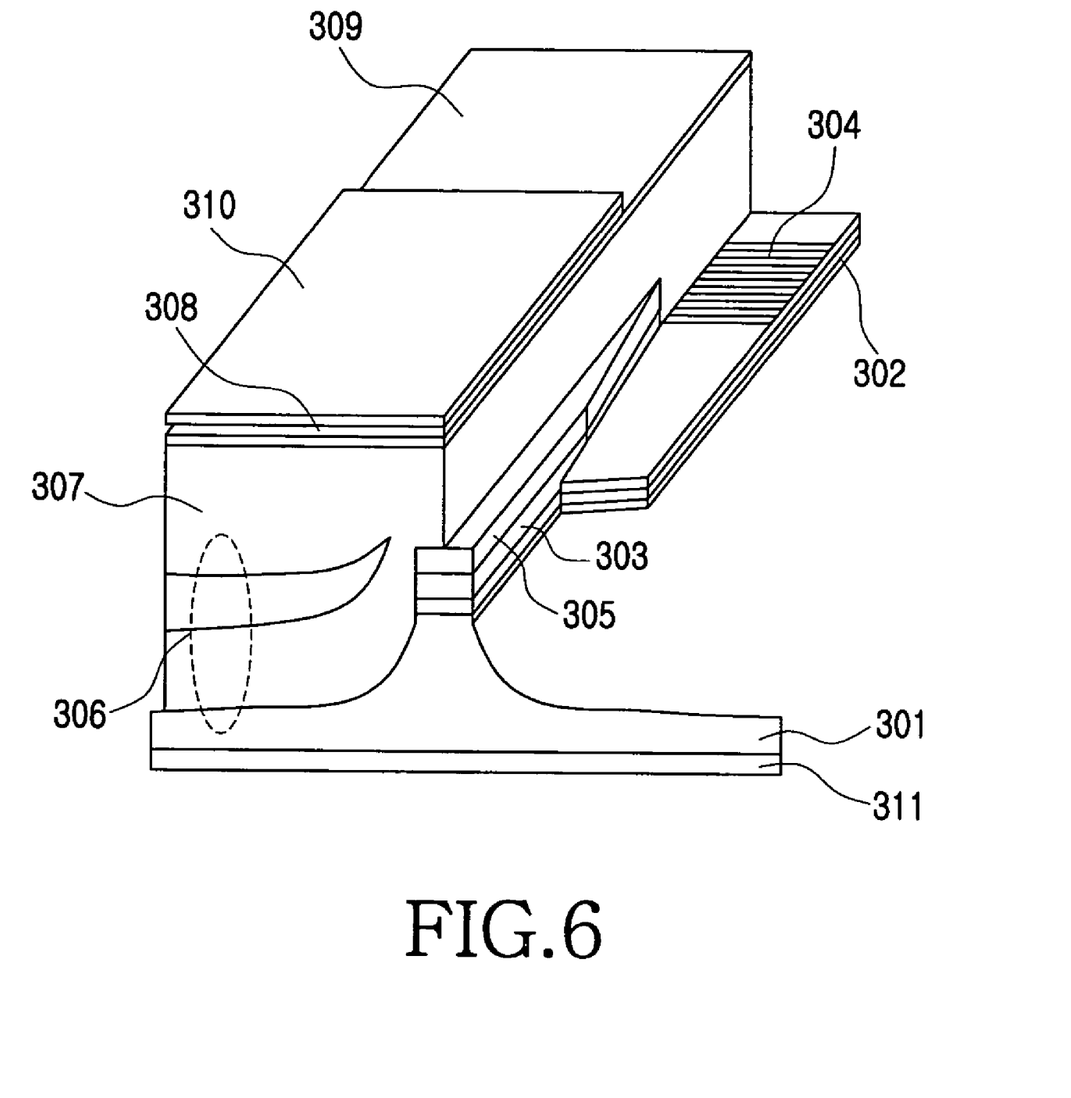
FIG. 6 is a schematic view illustrating a construction of a normal gain-clamped semiconductor optical amplifier.

FIG. 6 is a schematic view illustrating a construction of a typical gain clamped semiconductor optical amplifier. For the comprehension of the present invention, the schematic construction shown in FIG. 6 will be described as follows.

In FIG. 6, a semiconductor optical amplifier 202 comprises an n-InP substrate 301, an InGaAsP passive waveguide layer 302, an InP spacer 303, a DBR lattice pattern 304, an active-layer waveguide 305, a current-blocking layer 306, a p-type InP buffer layer 307, a p-type InGaAsP layer 308 for reducing an ohmic contact resistance, an oxide layer 309, an upper electrode 310, and a lower electrode 311.

Figure 7:
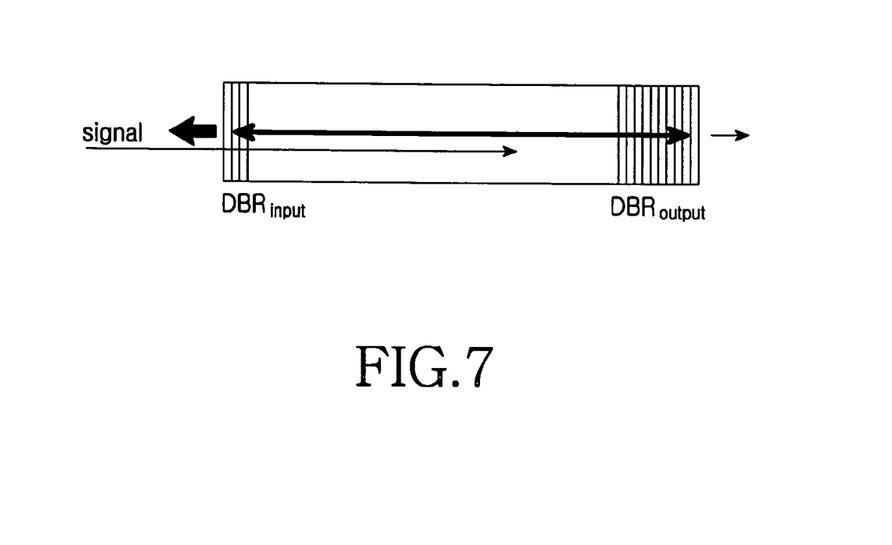
FIG. 7 is a view illustrating a lattice structure of a distributed Bragg reflector (DBR) in a semiconductor optical amplifier according to the present invention.
Figure 8:
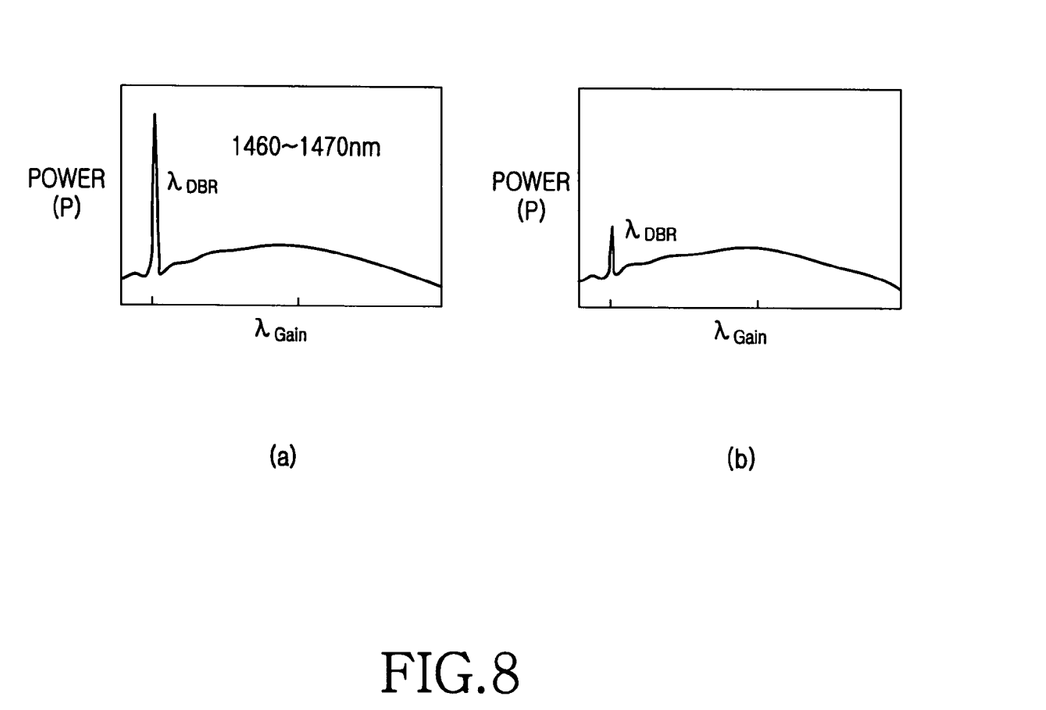
FIGS. 8a and 8b are views illustrating spectrums of amplified spontaneous emission light and Bragg peak at an input and an output terminal of a gain-clamped semiconductor optical amplifier having a DBR lattice structure according to the present invention.

The present invention is characterized by the lattice pattern of the distributed Bragg reflector (DBR). The lattice pattern of the DBR, as shown in FIG. 7, has an asymmetric structure between the input and the output terminal of the semiconductor optical amplifier. In this case, as shown in FIGS. 8a and 8b, the lattice pattern is formed in such a manner that an input section of an amplifier has a power of a lasing wavelength for gain clamping which is at least ten times larger than that of the output section of an amplifier. Thus, the powers of a lasing wavelength at the input end side and the output end side can be controlled by changing the number, the period, and the length of the lattice formed asymmetrically. For reference, a lattice structure of a DBR in a semiconductor optical amplifier according to the present invention is shown in FIG. 7.

FIGS. 8a and 8b show power ratios of amplified spontaneous emission light and Bragg peak according to the lattice structure of the DBR shown in FIG. 7, in which FIG. 8a shows a power of a lasing wavelength at an input end and FIG. 8b shows a power of a lasing wavelength at an output end.

Also, the present invention is constructed in such a manner that the Bragg wavelength of the DBR lattice is located on a shorter wavelength side distanced about 80 to 100 nm from the peak of a desired Raman gain spectrum, using the Raman gain characteristics in which a gain appears on a longer wavelength side distanced about 100 nm from the wavelength of a pumping light in the case of Raman amplification.

Referring back to FIG. 4, the optical isolator 203 prevents the degradation of the amplifier characteristics from the unintentionally reflected amplified spontaneous emission (ASE) or amplified signal.

Figure 9:
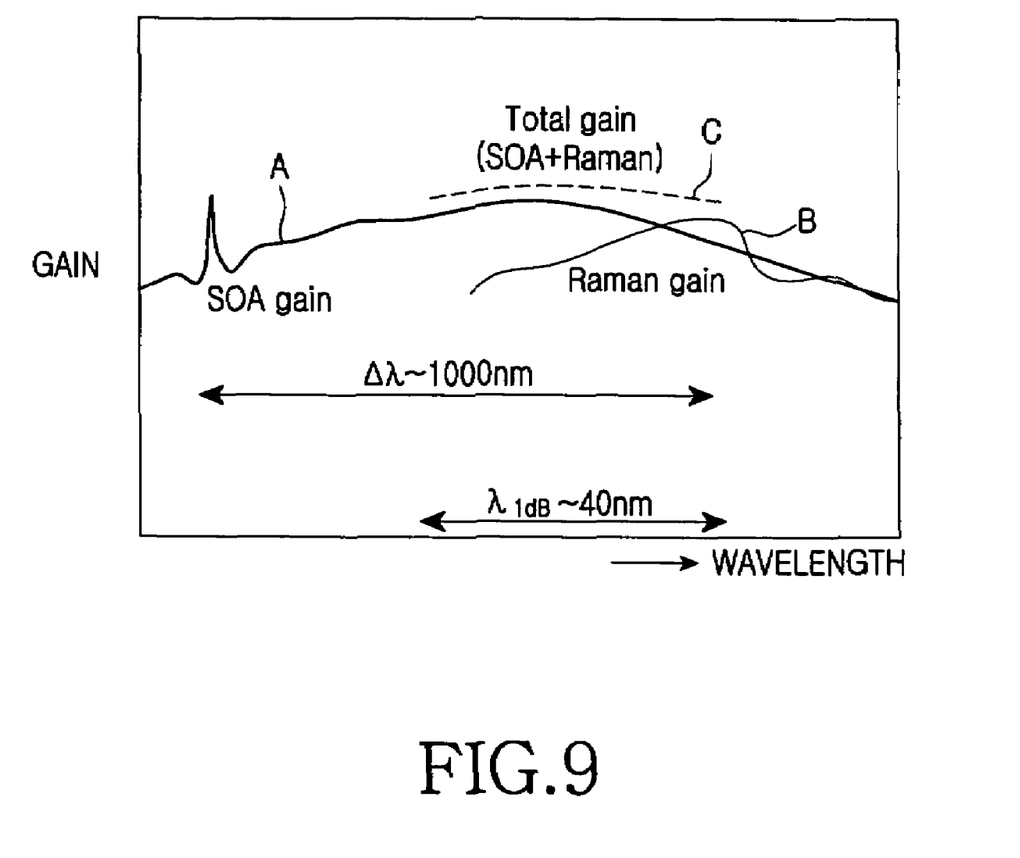
FIG. 9 is a view for explaining the gain spectrum characteristics of an optical amplifier according to the present invention.

FIG. 9 is a view for explaining the gain spectrum characteristics of an optical amplifier according to the present invention. In FIG. 9, reference mark 'A' designates a gain characteristics of a gain-clamped semiconductor optical amplifier, reference mark 'B' designates Raman gain characteristics formed by lasing wavelengths for gain clamping, and reference mark 'C' designates a gain characteristics in the case in which Bragg wavelength is adjusted on a gain-clamped semiconductor optical amplifier according to the present invention. Although definite numerical values are not entered, the result shows that the gain flatness in the C-band is lower than 0.5 dB.

Also, the power of the input terminal of the DBR laser is larger than 100 mW. In the case of a single-mode fiber, a Raman gain with an efficiency of 0.02 dB/mW can be obtained, and the noise figure is decreased as much as the Raman gain. If it is used that the another type of fiber, for example dispersion shifted fiber, the gain efficiency of Raman amplifier is changed. That is, the effective noise figure of a Raman amplifier is decreased inversely proportional to a gain value, therefore, a signal light, which undergoes Raman amplification at the front and is inputted into a semiconductor optical amplifier, become to have a noise figure decreased as much as the Raman gain.

Meanwhile, an optical amplifier according to the present invention may be implemented with a lattice pattern in which an input and an output terminal of a single-mode fiber have a structure asymmetrical to each other.

In this case also, like the DBR lattice pattern formed asymmetrically, the input terminal and the output terminal have a lattice structure asymmetric to each other in such a manner that the input power of the single-mode fiber has a power of at least ten times larger than the output power of the single-mode fiber. In the same manner, the asymmetric feature of optical output and the Bragg wavelength can be controlled by changing the number, the period, and the length of the lattice formed asymmetrically.

Also, the Bragg wavelength of the single-mode fiber lattice is located on a shorter wavelength side distanced about 80 to 100 nm from the peak of a desired Raman gain spectrum, using the Raman gain characteristics of optical fiber in which a gain appears on a longer wavelength side distanced about 100 nm from the wavelength of a pumping light in the case of Raman amplification.

As described above, an optical amplifier according to the present invention applies the Raman amplification principle to a conventional gain-clamped semiconductor optical amplifier, without a high-priced pumping laser diode for Raman amplification, by changing the DBR lattice structure of a gain-clamped semiconductor optical amplifier or the lattice structure of optical fiber.

Therefore, the optical amplifier according to the present invention has high gain and low noise figure characteristics, which are the characteristics of an optical amplifier module made by combining a Raman amplifier and a semiconductor optical amplifier, thereby greatly decreasing the size and the manufacturing cost as compared to the conventional optical amplifier module.

While the invention has been shown and described with reference to certain preferred embodiments thereof, it will be understood by those skilled in the art that various changes in form and details may be made therein without departing from the spirit and scope of the invention as defined by the appended claims. Accordingly, the scope of the invention is not to be limited by the above embodiments but by the claims and the equivalents thereof.

What is claimed is:

1. A gained-clamped semiconductor optical amplifier comprising:
   a single mode fiber adapted for receiving a pumping light;
   a semiconductor optical amplifier connected to an output of the single mode fiber for providing the pump light; and
   an optical isolator attached to an output of the semiconductor optical amplifier,
   wherein the single mode fiber is adapted to provide a gain from a longer wavelength side distanced by about 100 nm from a wavelength of the pumping light and to amplify an input signal light having a same wavelength as that of the gain.

2. A gain-clamped semiconductor optical amplifier that provides optical amplification by using semiconductor amplifier and Raman optical amplification principle, in which a pumping light is incidented into an optical fiber so as to cause a gain to appear on a longer wavelength side distanced by about 100 nm from the pumping light by stimulated Raman scattering and in which a signal light that the gain appears is subsequently incidented into the excited optical fiber for amplification, the gain-clamped semiconductor optical amplifier comprising:
   an optical fiber having Raman gain characteristics; and
   a gain-clamped semiconductor optical amplifier for providing a pumping light to the optical fiber by laser oscillation using a distributed Bragg reflector (DBR) lattice having input and output terminals asymmetrical to each other, and for amplifying a signal light Raman-amplified by the optical fiber.

3. The device according to claim 2, wherein the distributed Bragg reflector (DBR) lattice having an input and an output terminal asymmetrical to each other, is formed such that an optical power of the input terminal of the laser has a power of at least ten times larger than that of the output terminal of the laser.

4. The device according to claim 3, wherein the optical power of input terminal of the laser is 100 mW or more.

5. The device according to claim 2, wherein a pumping light supplied to the optical fiber has a wavelength band at least 70 nm shorter than a wavelength band of a transmission signal light.

6. The device according to claim 2, wherein the optical fiber is an optical fiber which can obtain a Raman gain.

7. The device according to claim 6, wherein the optical fiber is a single-mode fiber or dispersion shifted fiber.

8. A gain-clamped semiconductor optical amplifier using Raman amplification principle, the gain-clamped semiconductor optical amplifier comprising:
   an optical fiber having an input terminal and an output terminal with a lattice structure adapted to be asymmetrical to each other so as to exhibit Raman gain characteristics; and
   a semiconductor optical amplifier for amplifying a signal light that is Raman-amplified in the optical fiber by laser oscillation using a distributed Bragg reflector (DBR) lattice.

9. The device according to claim 8, wherein the lattice of the optical fiber, in which an input and an output terminal is asymmetrical to each other, is formed in such a manner that an optical power of an input terminal of the laser has a power of at least ten times larger than that of an output terminal of the laser.

10. The device according to claim 9, wherein the input power of the laser is 100 mW or more.

11. The device according to claim 8, wherein a pumping light supplied to the optical fiber has a wavelength band at least 70 nm shorter than a wavelength band of a transmission signal light.

12. The device according to claim 8, wherein the optical fiber is an optical fiber adapted for obtaining a Raman gain.

13. A gained-clamped semiconductor optical amplifier comprising:
   a single mode fiber adapted for supplying a pumping light;
   a semiconductor optical amplifier connected to an output of the single mode fiber; and
   an optical isolator attached to an output of the semiconductor optical amplifier,
   wherein the single mode fiber is adapted to provide a gain from a longer wavelength side distanced by about 100 nm from a wavelength of the pumping light, and amplifies an input signal light having a same wavelength as that of the gain.

14. A method for providing a gained-clamped semiconductor optical amplifier comprising:
   (a) providing an optical fiber for receiving a pumping light, said fiber is adapted to provide a gain from a longer wavelength side distanced by about 100 nm from a wavelength of the pumping light;
   (b) providing a semiconductor optical amplifier connected to an output of the fiber for supplying the pump light;
   (c) providing an optical isolator attached to an output of the semiconductor optical amplifier; and
   (d) supplying an input signal light to the fiber having a same wavelength as that of the gain from the pumping light for amplification.

15. The method according to claim 14, wherein a pumping light supplied to the optical fiber has a wavelength band at least 70 nm shorter than a wavelength band of a transmission signal light.

16. The method according to claim 14, wherein the gain of the pumping light is provided in step (a) by Raman scattering.

17. The method according to claim 14, wherein the semiconductor optical amplifier in step (b) uses laser oscillation comprising a distributed Bragg reflector (DBR) lattice having input and output terminals that are asymmetrical to each other.

18. The method according to claim 17, wherein the DBR lattice is formed so that an optical power of the input terminal is at least ten times larger than an optical power of the output terminal.

19. The method according to claim 14, wherein the fiber comprises a single mode fiber or dispersion shifted fiber.

20. The method according to claim 14, wherein a lattice of the optical fiber have an asymmetrical structure at an input and output section such that as to provide Raman gain characteristics.

* * * * *